US008481418B2

(12) United States Patent
Lee et al.

(10) Patent No.: US 8,481,418 B2
(45) Date of Patent: *Jul. 9, 2013

(54) LOW FABRICATION COST, HIGH PERFORMANCE, HIGH RELIABILITY CHIP SCALE PACKAGE

(75) Inventors: Jin-Yuan Lee, Hsin-Chu (TW);
Ming-Ta Lei, Hsin-Chu (TW);
Ching-Cheng Huang, Hsinchu (TW);
Chuen-Jye Lin, Taichung Hsien (TW)

(73) Assignee: Megica Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/930,220

(22) Filed: Oct. 31, 2007

(65) Prior Publication Data
US 2009/0137110 A9    May 28, 2009

Related U.S. Application Data

(60) Continuation of application No. 11/136,650, filed on May 24, 2005, now Pat. No. 7,338,890, which is a continuation of application No. 10/638,454, filed on Aug. 11, 2003, now Pat. No. 6,917,119, which is a division of application No. 09/953,525, filed on Sep. 17, 2001, now Pat. No. 6,642,136.

(51) Int. Cl.
*H01L 21/44* (2006.01)
(52) U.S. Cl.
USPC .................... 438/613; 438/614; 257/E21.508
(58) Field of Classification Search
USPC .................. 438/613, 614, E21.508; 257/737, 257/738, E21.508
See application file for complete search history.

(56) References Cited

U.S. PATENT DOCUMENTS

| | | | |
|---|---|---|---|
| 3,668,484 A | 6/1972 | Greig | |
| 4,087,314 A | 5/1978 | George | |

(Continued)

FOREIGN PATENT DOCUMENTS

| | | |
|---|---|---|
| EP | 1536469 | 6/2005 |
| JP | 60217646 | 10/1985 |

(Continued)

OTHER PUBLICATIONS

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

(Continued)

*Primary Examiner* — Phat X Cao
(74) *Attorney, Agent, or Firm* — Seyfarth Shaw LLP

(57) ABSTRACT

The invention provides a new method and chip scale package is provided. The inventions starts with a substrate over which a contact point is provided, the contact point is exposed through an opening created in the layer of passivation and a layer of polymer or elastomer. A barrier/seed layer is deposited, a first photoresist mask is created exposing the barrier/seed layer where this layer overlies the contact pad and, contiguous therewith, over a surface area that is adjacent to the contact pad and emanating in one direction from the contact pad. The exposed surface of the barrier/seed layer is electroplated for the creation of interconnect traces. The first photoresist mask is removed from the surface of the barrier/seed layer. A second photoresist mask, defining the solder bump, is created exposing the surface area of the barrier/seed layer that is adjacent to the contact pad and emanating in one direction from the contact pad. The solder bump is created in accordance with the second photoresist mask, the second photoresist mask is removed from the surface of the barrier/seed layer, exposing the electroplating and the barrier/seed layer with the metal plating overlying the barrier/seed layer. The exposed barrier/seed layer is etched in accordance with the pattern formed by the electroplating, reflow of the solder bump is optionally performed.

42 Claims, 5 Drawing Sheets

U.S. PATENT DOCUMENTS

| | | | |
|---|---|---|---|
| 4,179,802 A | 12/1979 | Joshi | |
| 4,652,336 A | 3/1987 | Andrascek | |
| 4,726,991 A | 2/1988 | Hyatt | |
| 4,811,237 A | 3/1989 | Putatunda | |
| 4,825,276 A | 4/1989 | Kobayashi | |
| 4,880,708 A | 11/1989 | Sharma et al. | |
| 5,046,161 A | 9/1991 | Takada | |
| 5,061,985 A | 10/1991 | Meguro et al. | |
| 5,071,518 A | 12/1991 | Pan | |
| 5,083,187 A | 1/1992 | Lamson | |
| 5,108,950 A | 4/1992 | Wakabayashi | |
| 5,132,775 A | 7/1992 | Brighton | |
| 5,134,460 A | 7/1992 | Brady | |
| 5,137,845 A | 8/1992 | Lochon | |
| 5,223,454 A | 6/1993 | Uda | |
| 5,226,232 A | 7/1993 | Boyd | |
| 5,239,447 A | 8/1993 | Cotues | |
| 5,244,833 A | 9/1993 | Gansauge et al. | |
| 5,261,155 A | 11/1993 | Angulas | |
| 5,268,072 A | 12/1993 | Agarwala | |
| 5,326,709 A | 7/1994 | Moon | |
| 5,418,186 A | 5/1995 | Park | |
| 5,468,984 A | 11/1995 | Efland | |
| 5,503,286 A | 4/1996 | Nye, III | |
| 5,534,465 A | 7/1996 | Frye | |
| 5,541,135 A | 7/1996 | Pfeifer | |
| 5,554,940 A | 9/1996 | Hubacher | |
| 5,565,379 A | 10/1996 | Baba | |
| 5,598,348 A | 1/1997 | Rusu | |
| 5,600,180 A | 2/1997 | Kusaka | |
| 5,629,241 A | 5/1997 | Matloubian | |
| 5,631,499 A | 5/1997 | Hosomi | |
| 5,656,858 A | 8/1997 | Kondo et al. | |
| 5,656,863 A | 8/1997 | Yasunaga | |
| 5,664,642 A | 9/1997 | Williams | |
| 5,726,502 A | 3/1998 | Beddingfield | |
| 5,736,791 A | 4/1998 | Fujiki | |
| 5,742,094 A | 4/1998 | Ting | |
| 5,756,370 A | 5/1998 | Farnworth | |
| 5,757,074 A | 5/1998 | Matloubian | |
| 5,767,010 A | 6/1998 | Mis | |
| 5,780,925 A | 7/1998 | Cipolla | |
| 5,808,900 A | 9/1998 | Buer | |
| 5,854,513 A | 12/1998 | Kim | |
| 5,866,949 A | 2/1999 | Schueller | |
| 5,874,781 A | 2/1999 | Fogal | |
| 5,877,078 A | 3/1999 | Yanagida | |
| 5,879,964 A | 3/1999 | Paik et al. | |
| 5,882,957 A | 3/1999 | Lin | |
| 5,883,435 A | 3/1999 | Geffken | |
| 5,892,273 A | 4/1999 | Iwasaki | |
| 5,895,947 A | 4/1999 | Lee et al. | |
| 5,898,222 A | 4/1999 | Farooq | |
| 5,903,343 A | 5/1999 | Ning | |
| 5,933,358 A | 8/1999 | Koh | |
| 5,937,320 A | 8/1999 | Andricacos | |
| 5,943,597 A | 8/1999 | Kleffner | |
| 5,946,590 A | 8/1999 | Satoh | |
| 5,977,632 A | 11/1999 | Beddingfield | |
| 5,985,765 A | 11/1999 | Hsiao | |
| 6,013,571 A | 1/2000 | Morrell | |
| 6,015,505 A | 1/2000 | David | |
| 6,028,363 A | 2/2000 | Lin | |
| 6,042,953 A | 3/2000 | Yamaguchi | |
| 6,043,672 A | 3/2000 | Sugasawara | |
| 6,051,450 A | 4/2000 | Ohsawa | |
| 6,075,290 A | 6/2000 | Schaefer et al. | |
| 6,077,726 A | 6/2000 | Mistry | |
| 6,093,964 A | 7/2000 | Saitoh | |
| 6,103,552 A | 8/2000 | Lin | |
| 6,107,180 A | 8/2000 | Munroe et al. | |
| 6,144,100 A | 11/2000 | Shen | |
| 6,144,102 A | 11/2000 | Amagai | |
| 6,157,080 A | 12/2000 | Tamaki | |
| 6,159,837 A | 12/2000 | Yamaji et al. | |
| 6,162,562 A | 12/2000 | Tsuji et al. | |
| 6,162,652 A | 12/2000 | Dass | |
| 6,166,444 A | 12/2000 | Hsuan et al. | |
| 6,177,731 B1 | 1/2001 | Ishida | |
| 6,180,265 B1 | 1/2001 | Erickson | |
| 6,181,569 B1 | 1/2001 | Chakravorty | |
| 6,187,680 B1 | 2/2001 | Costrini | |
| 6,194,309 B1 | 2/2001 | Jin | |
| 6,197,613 B1 | 3/2001 | Kung | |
| 6,198,169 B1 | 3/2001 | Kobayashi | |
| 6,198,619 B1 | 3/2001 | Fujioka | |
| 6,207,467 B1 | 3/2001 | Vaiyapuri | |
| 6,229,220 B1 | 5/2001 | Saitoh | |
| 6,229,711 B1 | 5/2001 | Yoneda | |
| 6,250,541 B1 | 6/2001 | Shangguan | |
| 6,258,705 B1 | 7/2001 | Chien | |
| 6,268,662 B1 | 7/2001 | Test | |
| 6,271,107 B1 | 8/2001 | Massingill | |
| 6,287,893 B1 | 9/2001 | Elenius et al. | |
| 6,294,406 B1 | 9/2001 | Bertin | |
| 6,311,147 B1 | 10/2001 | Tuan | |
| 6,319,830 B1 | 11/2001 | Yamaguchi | |
| 6,319,846 B1 | 11/2001 | Lin et al. | |
| 6,332,988 B1 | 12/2001 | Berger, Jr. | |
| 6,348,401 B1 | 2/2002 | Chen | |
| 6,362,087 B1 | 3/2002 | Wang et al. | |
| 6,372,619 B1 | 4/2002 | Huang et al. | |
| 6,372,622 B1 | 4/2002 | Tan | |
| 6,380,061 B1 | 4/2002 | Kobayashi | |
| 6,383,916 B1 | 5/2002 | Lin | |
| 6,405,357 B1 | 6/2002 | Chao | |
| 6,406,967 B1 | 6/2002 | Chung | |
| 6,414,390 B2 * | 7/2002 | Nozawa | 257/737 |
| 6,426,281 B1 | 7/2002 | Lin | |
| 6,426,556 B1 | 7/2002 | Lin | |
| 6,429,531 B1 | 8/2002 | Mistry | |
| 6,446,245 B1 | 9/2002 | Xing | |
| 6,452,270 B1 | 9/2002 | Huang | |
| 6,457,157 B1 | 9/2002 | Singh | |
| 6,462,426 B1 | 10/2002 | Kelkar et al. | |
| 6,467,674 B1 | 10/2002 | Mihara | |
| 6,479,900 B1 | 11/2002 | Shinogi et al. | |
| 6,495,397 B2 | 12/2002 | Kubota | |
| 6,501,169 B1 | 12/2002 | Aoki | |
| 6,518,092 B2 | 2/2003 | Kikuchi | |
| 6,518,651 B2 | 2/2003 | Hashimoto | |
| 6,523,154 B2 | 2/2003 | Cohn | |
| 6,538,331 B2 | 3/2003 | Masuda | |
| 6,541,847 B1 | 4/2003 | Hofstee | |
| 6,558,978 B1 | 5/2003 | McCormick | |
| 6,573,598 B2 | 6/2003 | Ohuchi | |
| 6,578,754 B1 | 6/2003 | Tung | |
| 6,592,019 B2 | 7/2003 | Tung | |
| 6,600,234 B2 | 7/2003 | Kuwabara | |
| 6,617,655 B1 | 9/2003 | Estacio et al. | |
| 6,620,728 B2 | 9/2003 | Lin | |
| 6,627,988 B2 | 9/2003 | Andoh | |
| 6,642,136 B1 | 11/2003 | Lee et al. | |
| 6,642,610 B2 | 11/2003 | Park | |
| 6,653,563 B2 | 11/2003 | Bohr | |
| 6,661,100 B1 | 12/2003 | Anderson | |
| 6,675,139 B1 | 1/2004 | Jetton | |
| 6,683,380 B2 | 1/2004 | Efland et al. | |
| 6,707,159 B1 | 3/2004 | Kumamoto et al. | |
| 6,709,985 B1 | 3/2004 | Goruganthu | |
| 6,731,003 B2 | 5/2004 | Joshi | |
| 6,732,913 B2 | 5/2004 | Alvarez | |
| 6,756,664 B2 | 6/2004 | Yang | |
| 6,762,122 B2 | 7/2004 | Mis | |
| 6,765,299 B2 | 7/2004 | Takahashi | |
| 6,774,475 B2 | 8/2004 | Blackshear | |
| 6,791,178 B2 | 9/2004 | Yamaguchi | |
| 6,809,020 B2 | 10/2004 | Sakurai | |
| 6,815,324 B2 | 11/2004 | Huang | |
| 6,841,872 B1 | 1/2005 | Ha et al. | |
| 6,853,076 B2 | 2/2005 | Datta | |
| 6,861,742 B2 | 3/2005 | Miyamoto | |
| 6,864,165 B1 | 3/2005 | Pogge | |
| 6,917,106 B2 | 7/2005 | Datta | |
| 6,917,119 B2 | 7/2005 | Lee | |
| 6,940,169 B2 | 9/2005 | Jin | |
| 6,963,136 B2 | 11/2005 | Shinozaki | |

| | | | |
|---|---|---|---|
| 6,977,435 | B2 | 12/2005 | Kim |
| 6,991,961 | B2 | 1/2006 | Hubbard |
| 6,998,710 | B2 | 2/2006 | Kobayashi |
| 6,998,711 | B1 | 2/2006 | Farrar |
| 7,008,867 | B2 | 3/2006 | Lei |
| 7,034,402 | B1 | 4/2006 | Seshan |
| 7,043,389 | B2 | 5/2006 | Plusquellic |
| 7,045,899 | B2 | 5/2006 | Yamane |
| 7,074,050 | B1 | 7/2006 | Bartley |
| 7,084,660 | B1 | 8/2006 | Ackaret |
| 7,095,105 | B2 | 8/2006 | Cherukuri |
| 7,098,127 | B2 | 8/2006 | Ito |
| 7,111,265 | B1 | 9/2006 | Tan |
| 7,119,002 | B2 | 10/2006 | Lin |
| 7,135,766 | B1 | 11/2006 | Costa |
| 7,135,770 | B2 | 11/2006 | Nishiyama |
| 7,196,001 | B2 | 3/2007 | Datta |
| 7,220,657 | B2 | 5/2007 | Ihara |
| 7,224,056 | B2 | 5/2007 | Burtzlaff |
| 7,246,432 | B2 | 7/2007 | Tanaka |
| 7,265,440 | B2 | 9/2007 | Zilber |
| 7,268,438 | B2 | 9/2007 | Nishiyama |
| 7,314,819 | B2 | 1/2008 | Hua |
| 7,335,536 | B2 | 2/2008 | Lange |
| 7,338,890 | B2 * | 3/2008 | Lee et al. ............ 438/613 |
| 7,355,288 | B2 | 4/2008 | Lee et al. |
| 7,449,406 | B2 | 11/2008 | Nishiyama |
| 7,456,089 | B2 | 11/2008 | Aiba |
| 7,462,942 | B2 | 12/2008 | Tan |
| 7,479,398 | B2 | 1/2009 | Zilber |
| 7,479,690 | B2 | 1/2009 | Shiraishi |
| 7,495,341 | B2 | 2/2009 | Zilber |
| 7,505,284 | B2 | 3/2009 | Offrein |
| 2001/0000080 | A1 | 3/2001 | Nozawa |
| 2001/0026021 | A1 * | 10/2001 | Honda ............ 257/778 |
| 2001/0026954 | A1 | 10/2001 | Takao |
| 2001/0039642 | A1 | 11/2001 | Anzai |
| 2001/0040290 | A1 * | 11/2001 | Sakurai et al. ............ 257/737 |
| 2002/0016079 | A1 | 2/2002 | Dykstra et al. |
| 2002/0043723 | A1 | 4/2002 | Shimizu |
| 2002/0079576 | A1 | 6/2002 | Seshan |
| 2002/0100975 | A1 | 8/2002 | Kanda |
| 2002/0121709 | A1 * | 9/2002 | Matsuki et al. ............ 257/786 |
| 2003/0006062 | A1 | 1/2003 | Stone |
| 2003/0008133 | A1 | 1/2003 | Paik et al. |
| 2003/0020163 | A1 | 1/2003 | Hung et al. |
| 2003/0052409 | A1 | 3/2003 | Matsuo et al. |
| 2003/0080416 | A1 | 5/2003 | Jorger et al. |
| 2003/0127734 | A1 | 7/2003 | Lee et al. |
| 2003/0151047 | A1 | 8/2003 | Corbett |
| 2003/0162383 | A1 | 8/2003 | Yamaya et al. |
| 2003/0168733 | A1 | 9/2003 | Hashimoto |
| 2003/0218246 | A1 | 11/2003 | Abe |
| 2003/0219966 | A1 | 11/2003 | Jin et al. |
| 2004/0007779 | A1 | 1/2004 | Arbuthnot |
| 2004/0048202 | A1 | 3/2004 | Lay et al. |
| 2004/0088443 | A1 | 5/2004 | Tran |
| 2004/0163054 | A1 | 8/2004 | Frank |
| 2004/0268281 | A1 | 12/2004 | Dotson |
| 2005/0050502 | A1 | 3/2005 | Kurihara |
| 2005/0090916 | A1 | 4/2005 | Aghababazadeh |
| 2006/0080630 | A1 | 4/2006 | Lin |
| 2006/0239102 | A1 | 10/2006 | Saita |
| 2008/0099928 | A1 | 5/2008 | Lee et al. |
| 2008/0111236 | A1 | 5/2008 | Lee et al. |
| 2008/0113504 | A1 | 5/2008 | Lee et al. |
| 2008/0284037 | A1 | 11/2008 | Andry |

FOREIGN PATENT DOCUMENTS

| | | |
|---|---|---|
| JP | 62160744 | 7/1987 |
| JP | 1061038 | 3/1989 |
| JP | 03022437 | 1/1991 |
| JP | 4278543 | 10/1992 |
| JP | 4318935 | 11/1992 |
| JP | 1961221 | 8/1995 |
| JP | 1985660 | 10/1995 |
| JP | 8013166 | 1/1996 |
| JP | 2785338 | 8/1998 |
| JP | 2000260803 | 9/2000 |
| JP | 2002016096 | 1/2002 |
| JP | 2003133477 | 5/2003 |
| JP | 2003234367 | 8/2003 |
| JP | 2003282788 | 10/2003 |
| JP | 2006128662 | 5/2006 |
| JP | 2006147810 | 6/2006 |
| JP | 3829325 | 10/2006 |
| JP | 3850261 | 11/2006 |
| JP | 3856304 | 12/2006 |
| TW | 393709 | 6/2000 |
| TW | 396419 | 7/2000 |
| TW | 397933 | 7/2000 |
| TW | 418470 | 1/2001 |
| TW | 419764 | 1/2001 |
| TW | 419765 | 1/2001 |
| TW | 423081 | 2/2001 |
| TW | 434857 | 5/2001 |
| TW | 434860 | 5/2001 |
| TW | 452950 | 9/2001 |

OTHER PUBLICATIONS

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-StaticDischarge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects on Power Supply Clamps," Proceedings of the 6th International Sympoisum on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SiLK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick Metal 9 Redistribution Layer and Cu Die Bump for 45nm High Volume Manufacturing," International Inteconnect Technology Conference (2008) pp. 216-218.

Kurd, N. et al. "Next Generation Intel® Micro-architecture (Nehalem) Clocking.Architecture," Symposium on VLSI Circuits Digest of Technical Papers (2008) pp. 62-63.

Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging," Proceedings of the Third International Symposium on Ultra Large Scale Integration Science and Technology (1991) pp. 667-677.

Luther, B. et al. "Planar Copper-Polyimide Back End of the Line Interconnections for VLSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology—High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™—MEGIC® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

U.S. Appl. No. 09/953,525, filed Sep. 17, 2001, Owens, Douglas W, Issued as Patent No. 6642136.

U.S. Appl. No. 10/638,454, filed Aug. 11, 2003, Cao, Phat X, Issued as Patent No. 6917119.

U.S. Appl. No. 11/120,234, filed May 2, 2005, Cao, Phat X, Issued as Patent No. 7355288.

U.S. Appl. No. 11/136,650, filed May 24, 2005, Cao, Phat X, Issued as Patent No. 7338890.

U.S. Appl. No. 11/930,210, filed Oct. 31, 2007, Cao, Phat X, Response to Non-Final Rejection entered Jun. 24, 2011.

U.S. Appl. No. 11/930,213, filed Oct. 31, 2007, Cao, Phat X, Response to Non-Final Rejection entered Jul. 12, 2011.

U.S. Appl. No. 11/930,220, filed Oct. 31, 2007, Cao, Phat X, Non-Final OA mailed May 27, 2011.

U.S. Appl. No. 11/930,224, filed Oct. 31, 2007, Parker, John M, Docketed—Ready for Examination.

* cited by examiner

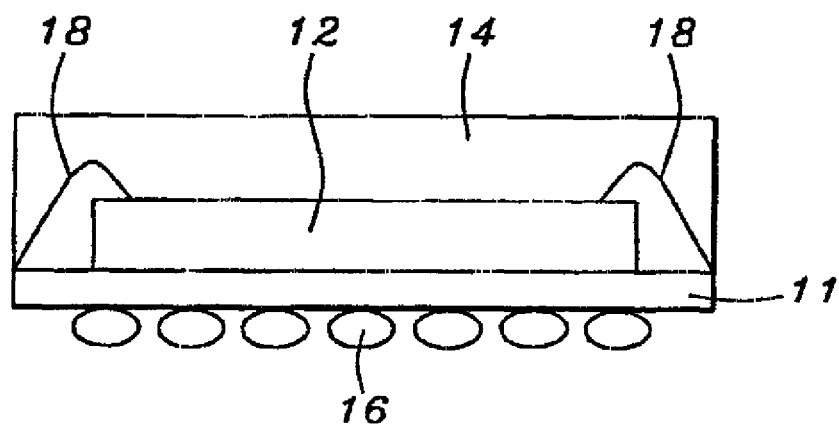
FIG. 1 - Prior Art
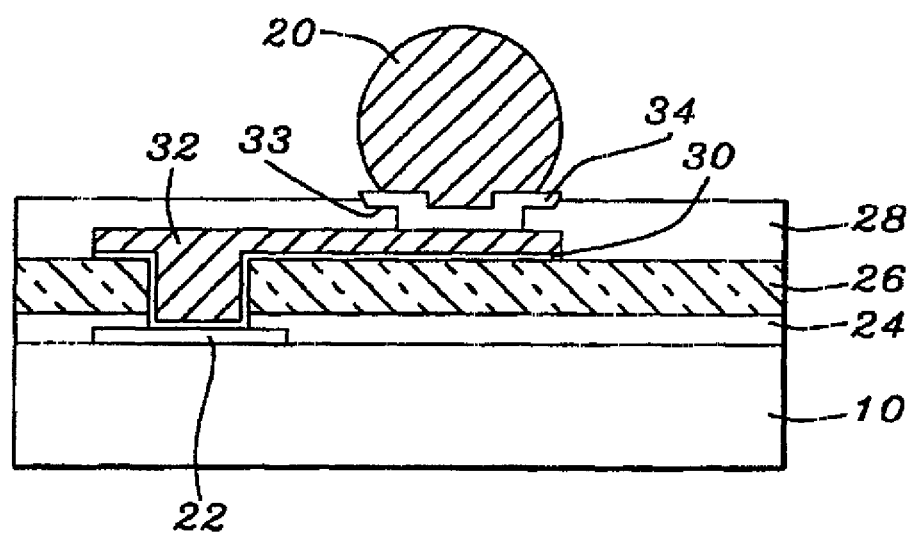
FIG. 2 - Prior Art

US 8,481,418 B2

LOW FABRICATION COST, HIGH PERFORMANCE, HIGH RELIABILITY CHIP SCALE PACKAGE

This application is a continuation of application Ser. No. 11/136,650, filed on May 24, 2005, now U.S. Pat. No. 7,338,890, which is a continuation of application. Ser. No. 10/638,454, filed on Aug. 11, 2003, now U.S. Pat. No. 6,917,119, which is a division of application Ser. No. 09/953,525, filed on Sep. 17, 2001, now U.S. Pat. No. 6,642,136.

BACKGROUND OF THE INVENTION

1. Field of the Invention

The invention relates to the fabrication of integrated circuit devices, and more particularly, to a method and package for semiconductor devices.

2. Description of the Prior Art

The creation of semiconductor devices, also referred to as Integrated Circuits (IC) has been made possible by the rapid development of supporting technologies such as photolithography and methods of etching. Most of these technologies have over the years had to address concerns created by a continued decrease in device dimensions and increase in device densities. This effort of creating improved performance devices does is not limited in its impact on the device itself but extends into the methods and packages that are used to further interconnect semiconductor devices and to protect these devices from environmental damage. This latter issue has created a packaging technology that is also driven by continuing demands of device miniaturization and denser packaging of devices, this at no penalty to device performance and in a cost-effective manner.

Semiconductor device packaging typically mounts a device on a substrate, such as semiconductor substrates, printed circuit boards, flex circuits, metallized substrates, glass substrates and semiconductor device mounting support. Such a substrate can be a relative complex structure, having multiple payers of interconnect metal distributed throughout the height of the substrate in addition to having interconnect traces created on one or both surfaces of the substrate. In addition, in order to enable the mounting of semiconductor over the surface of the substrate, contact pads such as bond pads are typically provided over at least one of the surfaces of a substrate. For more complex packages, several levels of packaging may be applied whereby a semiconductor device is mounted on a substrate and connected to interconnect metal that is part of the substrate, the first level substrate may be further mounted over the surface of a larger substrate from which the device is interconnected to surrounding circuitry or electrical components. Limitations that are imposed on this method of packaging are typically limitations of electrical performance that is imposed on the device by the packaging interface. For instance, of key concerns are RC delays in the transmission of signals over the various interconnect traces. This places a restraint of size and therefore packaging density on the package. Also of concern are considerations of parasitic capacitance and inductance that are introduced by the package since these parameters have a negative impact on device performance, a more serious impact on high frequency device performance. These parasitic components must therefore be minimized or suppressed to the maximum extent possible.

One or the more conventional methods of connecting a semiconductor device to surrounding points of interconnect is the use of a solder bump. Typically a semiconductor device will be provided on the active surface of the device with points of electrical interconnect which electrically access the device. To connect these points of interconnect to for instance a printer circuit board, solder bumps are provided on the surface of the circuit board that align with the points of electrical contact of the device. The creation of this interface is also subject to requirements imposed by electrical performance of the completed package, by requirements of package miniaturization, reliability, cost performance and the like. The invention provides a package that addresses these packaging concerns in addition to others.

U.S. Pat. No. 6,181,569 (Charkravorty) shows a solder bump process and structure that includes trace formation and bump plating.

U.S. Pat. No. 6,107,180 (Munroe et al.) shows a bump process using UBM and solder bumps.

U.S. Pat. No. 5,879,964 (Paik et al.) shows a related bump and interconnect process.

SUMMARY OF THE INVENTION

A principle objective of the invention is to provide a high-pillar solder bump that sustains a high stand-off of the complete solder bump while maintaining high bump reliability and minimizing damage caused by mismatching of thermal stress factors between the interfacing surfaces.

Another objective of the invention is to provide a method that further improves bump reliability by reducing mechanical and thermal stress.

Yet another objective of the invention is to provide re-distribution bumps which enable the creation of a flip-chip package without requiring a change in the design of the Integrated Circuit and without modifying the pad pitch, the performance of the package is improved and the package size does not need to be modified.

A still further objective of the invention is to provide a chip scale package using one UBM layer of metal, significantly reducing costs of fabrication and materials.

A still further objective of the invention is to provide a chip scale package whereby the solder ball is removed from the semiconductor device, eliminating the need for low-alpha solder, thus reducing fabrication cost and concerns of soft-error occurrence.

In accordance with the objectives of the invention a new method and chip scale package is provided. The inventions starts with a substrate over which a contact point is provided, the contact point and the surface of the substrate are protected by a layer of passivation, the contact point is exposed through an opening created in the layer of passivation. A layer of polymer or elastomer is deposited over the layer of passivation, an opening is created through the layer of polymer or elastomer that aligns with the contact point (contact pad), exposing the contact pad. A barrier/seed layer is deposited over the surface of the layer of polymer or elastomer, including the inside surfaces of the opening created through the layer of polymer or elastomer and the exposed surface of the contact pad. A first photoresist mask is created over the surface of the barrier/seed layer, the first photoresist mask exposes the barrier/seed layer where this layer overlies the contact pad and, contiguous therewith, over a surface area that is adjacent to the contact pad and emanating in one direction from the contact pad. The exposed surface of the barrier/seed layer is electroplated for the creation of interconnect traces. The first photoresist mask is removed from the surface of the barrier/seed layer, a second photoresist mask is created exposing the surface area of the barrier/seed layer that is adjacent to the contact pad and emanating in one direction from the contact pad. The second photoresist mask defines that solder bump. The solder bump is created in accordance with the second photoresist mask, the second photoresist mask is removed from the surface of the barrier/seed layer, exposing the electroplating and the barrier/seed layer with the metal plating overlying the barrier/seed layer. The exposed barrier/seed layer is etched in accordance with the pattern formed by the electroplating, reflow of the solder bump is optionally performed.

BRIEF DESCRIPTION OF THE DRAWINGS

FIG. 1 shows a cross section of a conventional mini-BGA package.

FIG. 2 shows a cross section of a conventional re-routing bump.

FIG. 3 shows a cross section of a silicon substrate, a top metal contact pad has been provided, a layer of passivation and a layer of polymer or elastomer have been deposited and patterned over the surface of the BGA substrate.

FIG. 4 shows a cross section after a barrier/seed layer has been deposited.

FIG. 5 shows a cross section after a first photoresist mask has been created over the surface of the barrier/seed layer, electroplating has been applied for the deposition of metal for the formation of interconnect traces.

FIG. 6 shows a cross section after the first photoresist mask has been removed from the surface of the barrier/seed layer.

FIG. 7 shows a cross section after a second photoresist mask has been created over the surface of the barrier/seed layer, including the surface of the electroplated interconnect metal; the second photoresist mask defines the solder bump.

FIG. 8 shows a cross section after the solder bump has been electroplated in accordance with the second photoresist mask.

DESCRIPTION OF THE PREFERRED EMBODIMENTS

Figure 3:
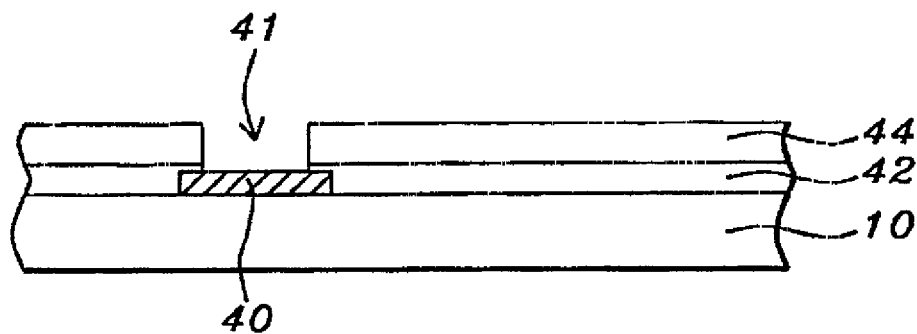
FIGS. 3 through 8 detail the process flow of the invention, as follows.

Two prior art applications are shown in the cross sections of FIGS. 1 and 2, specifically in the cross section of FIG. 1 are shown:

11, a BGA substrate such as a printed circuit board and the like
12, a semiconductor device or die
14, a molding compound that is used to encapsulate the die 12
16, solder balls that form the electrical interface between the package shown in cross section in FIG. 1 and surrounding circuitry; these solder balls can for instance be further connected to contact pads on the surface of a Printed Circuit Board (PCB)
18, bond wires used to connect points of electrical contact (not shown) on the active surface of die 12 with contact pads (not shown) on the second or upper surface of BGA substrate 11.

FIG. 2 shows a cross section of a conventional re-routing bump, the re-routing applies since the solder bump that is shown in cross section in FIG. 2 does not align with the contact pad with which the solder bump is connected. The elements that are highlighted in the cross section of FIG. 2 are the following:

10, a device supporting silicon substrate
20, a solder ball
22, top metal contact point
24, a layer of passivation, applied for the protection of the underlying surface and the surface of the layer 22 of top metal
26, a layer of dielectric material
28, a layer of passivation, applied for the protection of the underlying layer 26 of dielectric and the surface of the layer 32 of re-routing metal
30, a seed and/or barrier layer
32, a patterned layer of re-routing metal
33, a seed layer, and
34, a layer of UBM metal.

FIGS. 3 through 9 will now be used to describe the invention. Referring specifically to the cross section that is shown in FIG. 3, there is shown:

10, a semiconductor supporting surface such as the surface of a silicon substrate
40, a contact pad or top metal pad that has been provided in or on the surface of the substrate layer 10
42, a layer of passivation deposited over the surface of layer 10; the layer 42 of passivation has been patterned and etched, creating on opening 41 through the layer 42 of passivation that aligns with the contact pad 40
44, a layer of polymer or elastomer that has been deposited over the surface of the layer 42 of passivation; the layer 44 of polymer or elastomer has been patterned and etched, creating on opening 41 through the layer 42 of polymer or elastomer that aligns with the contact pad 40. Contact pad 40 can comprise aluminum or copper or a compound thereof.

As materials that can be used as a polymer for the deposition of layer 44 can be cited polyimide, parylene or teflon, electron resist, solid organics or inorganics, BCB (bisbenzocyclobutene), PMMA (poly-methyl-methacrylate), teflon which is a polymer made from PTFE (polytetrafluoroethylene), also polycarbonate (PC), polysterene (PS), polyoxide (PO) and poly polooxide (PPO).

The semiconductor supporting surface 10 can be semiconductor substrates, printed circuit boards, flex circuits, metallized substrates, glass substrates and semiconductor device mounting support, whereby the semiconductor substrate can selected from the group of substrates consisting of semiconductor substrates, ceramic substrates, glass substrates, gallium arsenide substrates, silicon on insulator (SOI) substrates and silicon on sapphire (SOS) substrates.

Figure 4:
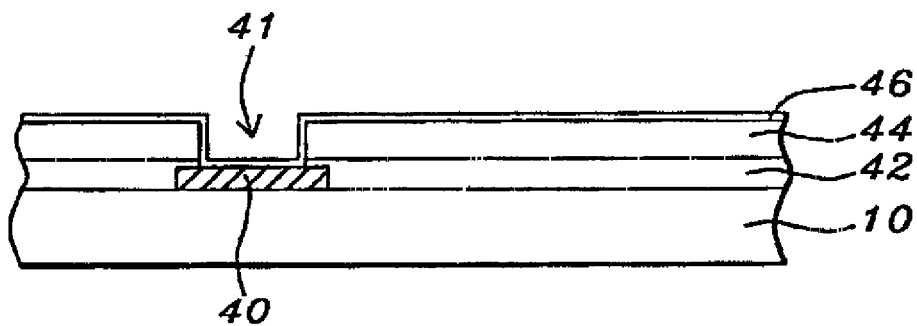

FIG. 4 shows a cross section of the semiconductor substrate after a layer 46 of barrier/seed material has been deposited over the surface of layer 44 of polymer or elastomer; inside surface of opening 41 have also been covered with the layer 46 of barrier/seed material.

A typical barrier layer 46 is deposited using rf. sputtering of titanium nitride, tantalum, tungsten, niobium, molybdenum, Ti/TiN or Ti/W and is more preferably formed from TiN. The barrier layer 46 can also be used to improve the adhesion of a subsequent overlying metal layers. A barrier layer is preferably about 100 and 1000 angstrom thick.

To further enhance the adhesion of a copper interconnect line to the surrounding layer of dielectric or insulation, a seed layer is deposited over the barrier layer. A seed layer can be deposited using a sputter chamber or an Ion Metal Plasma (IMP) chamber at a temperature of between about 0 and 300 degrees C. and a pressure of between about 1 and 100 mTorr, using copper or a copper alloy as the source at a flow rate of between about 10 and 400 sccm and using argon as an ambient gas. The minimum thickness of a seed layer is about 5,000 Angstrom, this thickness is required achieve a reliable gap fill.

Figure 5:
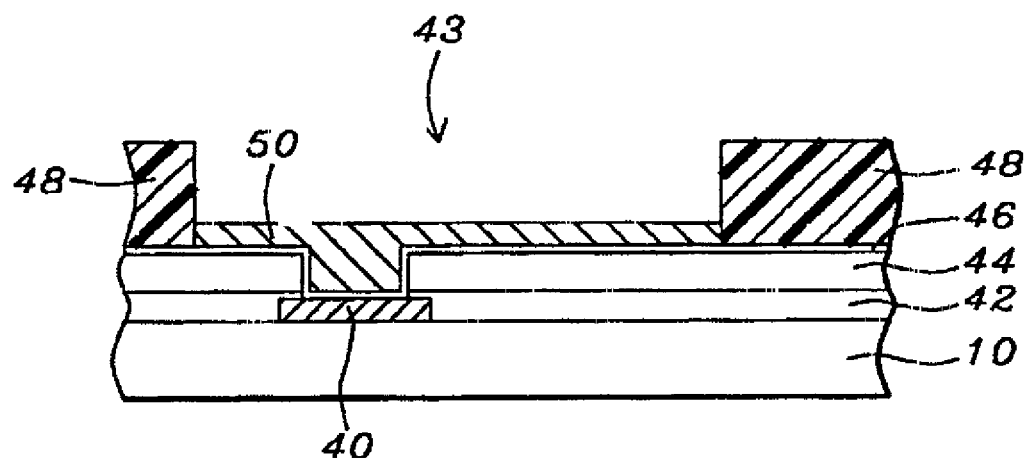

FIG. 5 shows a cross section after:
48, a first photoresist mask has been formed over the surface of barrier/seed layer 46, exposing the surface of the barrier/seed layer 46, and
50, a layer 50 of metal has been over the exposed surface of the barrier/seed layer 46 in accordance with the opening 43 created in the first photoresist mask.

The process of deposition and patterning a layer of photoresist uses conventional methods of photolithography and masking. Layer 48 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained. The opening 43 that is in this manner created in the layer 48 of photoresist exposes the surface of the layer 44 of barrier/seed material over a surface area where re-routing metal has to be created.

Figure 6:
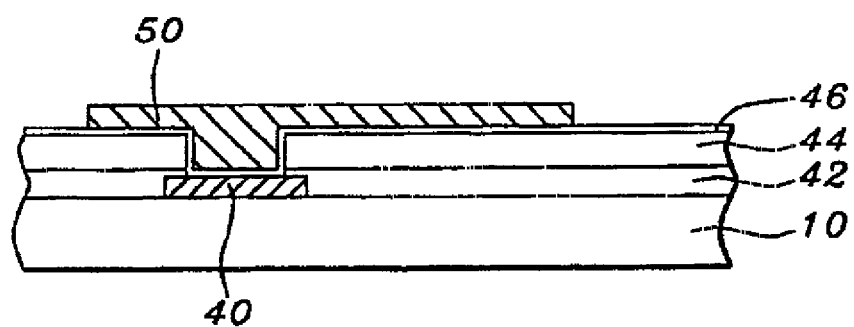

Removal of the first photoresist mask 48 from the surface of the barrier/seed layer 46 results in the cross section that is shown in FIG. 6.

Figure 7:
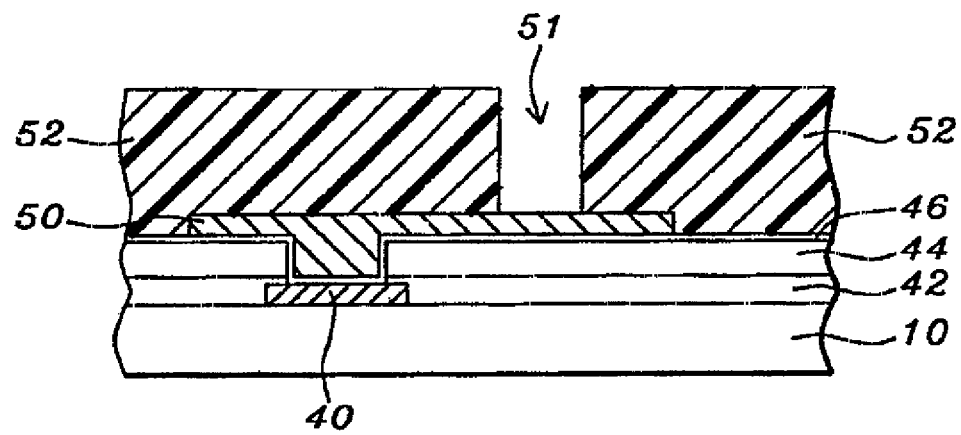

The invention continues with the cross section that is shown in FIG. 7, shown are:
52, a second photoresist mask is created over the surface of the barrier/seed layer 46, including the surface of the interconnect metal layer 50, and
51 opening created in the second layer 52 of photoresist, exposing the surface of layer 50 of interconnect metal; opening 51 defined the location and size (diameter) of the to be created solder bump.

Figure 8:
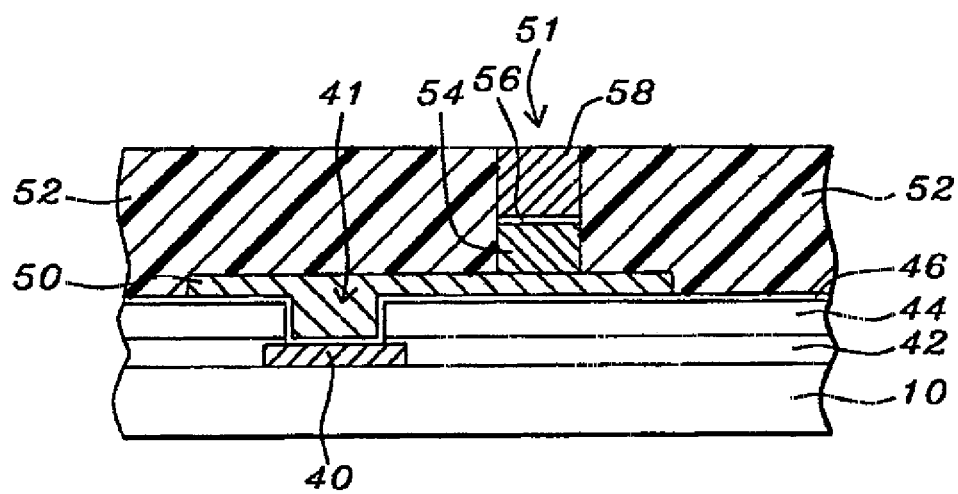
Figure 9:
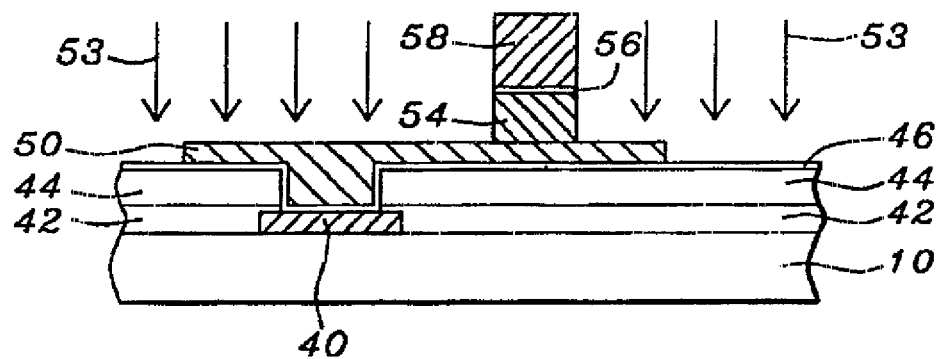
FIG. 9 shows a cross section after removal of the second photoresist mask, exposing the surface of the barrier/seed layer and the electroplated interconnect metal.

The cross section that is shown in FIG. 8 is after the opening 51 created in the second layer of dielectric has been filled with solder bump material. These materials can be selected as:
layer 54 being a first layer of metal, typically comprising copper, deposited to a thickness between about 10 and 100 μm, and more preferably to a thickness of about 50 μm
layer 56 being an UBM layer, typically comprising nickel, deposited to a thickness between about 1 and 10 μm, and more preferably to a thickness of about 5 μm, forming an integral part of the pedestal of the to be created interconnect bump, and
layer 58 is a layer of solder compound, deposited to a thickness between about 10 and 100 μm, and more preferably to a thickness of about 50 μm.

With the completion of the electroplating of these three layers, the solder bump is essentially complete. The second solder mask 52, FIG. 8, is therefore removed from the surface of the barrier/seed layer 46 and the surface of the interconnect metal 50, see FIG. 9, exposing the barrier/seed layer 46 and the interconnect metal 50, a pattern of barrier/seed material overlying the barrier/seed layer 46.

It is good practice and can be of benefit in the creation of the layers 54, 56 and 58 of metal to perform, prior to the electroplating of these layers of metal, an in-situ sputter clean of the exposed surface (exposed through opening 51) of the layer 50 of re-routing metal.

Figure 10:
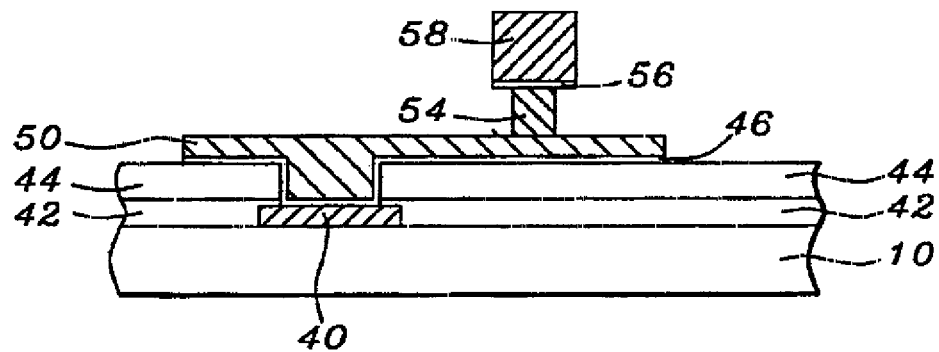
FIG. 10 shows a cross section after the barrier/seed layer has been etched in accordance with the layer of interconnect metal.

The barrier/seed layer 46 can now be etched using the patterned layer 50 of interconnect metal as a mask, which leads to the cross section that is shown in FIG. 10.

It is further good practice to oxidize the surface of the UBM and pillar metal by chemical or thermal oxidation. The chemical oxidation could be an $H_2O_2$ oxidation process, at a temperature in excess of about 150 degrees C. These processing steps can further help prevent wetting of the solder bump to the metal traces.

Reflow can optionally be applied the layer 58 of solder compound, creating a spherical layer 58 of solder which forms the solder bump (not shown). It must be noted in the cross section that is shown in FIG. 10 that the diameter of the UBM layer 54 is, during and as a consequence of the etching of the barrier/seed layer 46, reduced in diameter. This allows the solder ball 58 to be removed from the surface of the substrate by a relatively large distance. From this follows the advantage that it is no longer required that low-alpha solder is used for the solder compound of solder ball 58 reducing manufacturing cost in addition to reducing concerns of memory soft-error conditions.

Layer 56 of UBM may contain multiple layers of metal such as a layer of chrome, followed by a layer of copper, followed by a layer of gold. From the latter it is apparent that layer 56 of UBM may comprise several layers of metal that are successively deposited.

Figure 11:
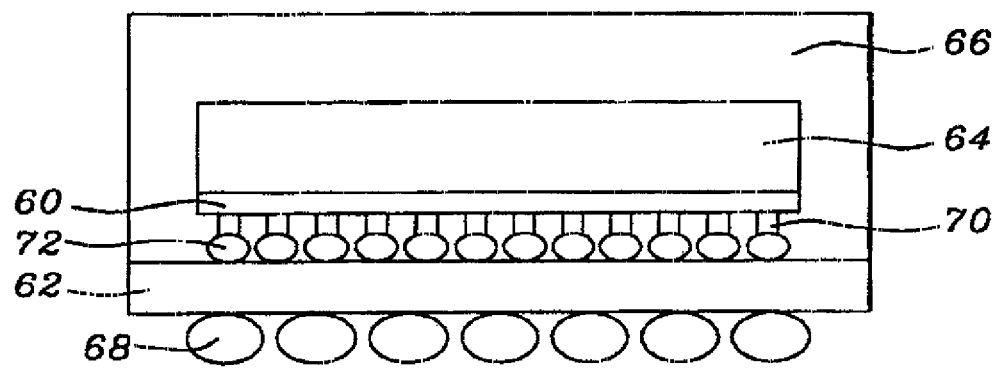
FIG. 11 shows a cross section of the package of the invention with a molding compound as encapsulant.
Figure 12:
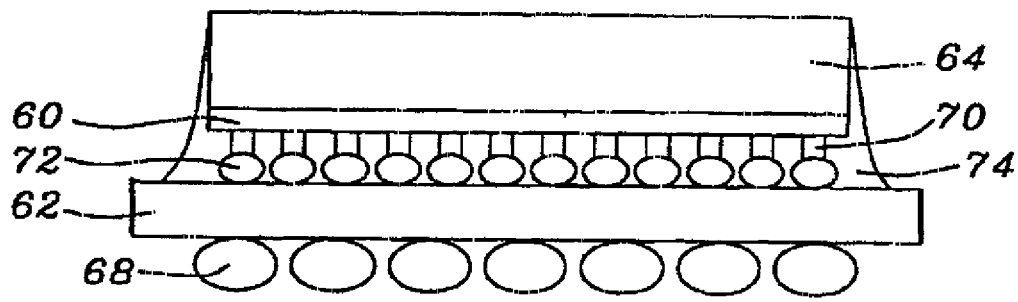
FIG. 12 shows a cross section of the package of the invention with underfill as encapsulant.

Examples of the application of the package of the invention are shown in cross section in FIGS. 11 and 12. Highlighted in FIG. 11 are:
60, a polymer or elastomer layer provided by the invention, similar to layer 44 of FIG. 3 e.a.
62, a BGA substrate over which a semiconductor device is to be mounted
64, a semiconductor device
66, a molding compound applied to encapsulate the device 64
68, contact balls to the package of the invention
70, pillar metal, similar to layers 54 and 56 of FIG. 8 e.a., and
72, a solder bump, similar to layer 58 of FIG. 8 after thermal reflow has been applied to this layer.

Shown in cross section in FIG. 12 is another application of the invention. The elements that have been applied above under FIG. 11 are valid for the cross section shown in FIG. 12 with the exception of element 74, which in the cross section of FIG. 12 is an underfill that has been applied under semiconductor device 64 and that replaces layer 66 of molding compound in FIG. 11 as the means for encapsulating the device 64.

Figure 13:
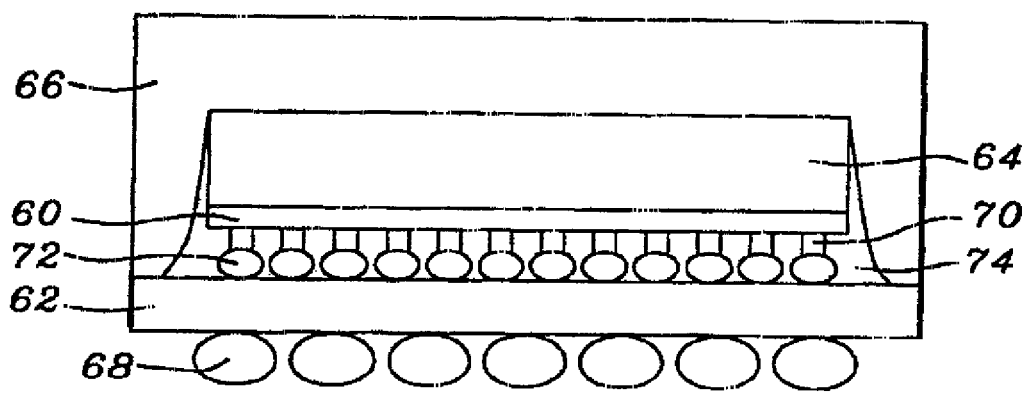
FIG. 13 shows a cross section of the package of the invention using both molding and an underfill.
Figure 14:
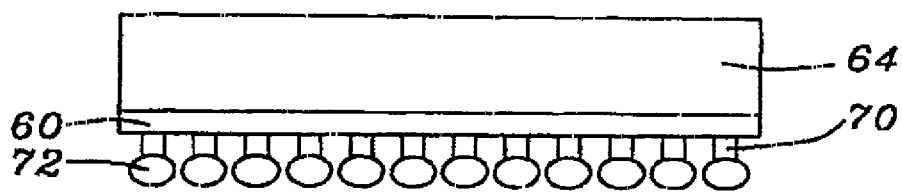
FIG. 14 shows a cross section of the package of the invention as a bare die that can be directly attached to a next level substrate.

FIGS. 13 and 14 show additional applications of the invention with FIG. 13 showing a cross section of the package of the invention using both molding and an underfill while FIG.

14 shows a cross section of the package of the invention as a bare die that can be directly attached to a next level substrate. All elements of the cross sections that are shown in FIGS. 13 and 14 have previously been described and need therefore not been further highlighted at this time.

In order to better highlight the differences between the prior art solder bump, as shown in cross section in FIG. 2, and the solder bump of the invention, as shown in the cross section of FIG. 10, the processing steps to create these two solder bumps are listed below. These steps are easier to follow if it is realized that both methods require and apply two metal fill plating steps, the first of these two step is to create a patterned layer of re-routing metal, the second is to create the solder bump. The processing sequences are as follows:

1. the prior art starts with a device support substrate, a contact pad has been created over the surface of the substrate, layers of passivation and dielectric have been deposited over the surface of the substrate and patterned to expose the contact pad; the invention starts with the same structure
2. the prior art deposits a first seed layer over the surface of the layer of dielectric; the invention does the same
3. the prior art performs a first metal fill over the first seed layer by creating a layer of metal that serves as re-routing metal; the invention does the same
4. the prior art etches the first seed layer; the instant invention does not perform this step at this time
5. the prior art deposits and patterns a layer of passivation, exposing the surface of the layer of re-routing metal, the patterned second layer of passivation serves as a mask for the reflow of the solder bump; the instant invention does not perform this step because the solder bump structure will not wet to the re-routing metal
6. the prior art deposits a second seed layer over the surface of the layer of passivation; the instant invention does not deposit a second seed layer
7. the prior art plates a layer of UBM over which a layer of solder compound is plated; the instant invention deposits a layer of UBM and two metal plating steps, the first metal plating step plating a layer of metal, such as copper or nickel that forms an integral part of the pedestal of the to be created interconnect bump, the second metal plating step depositing a solder compound
8. the prior art performs reflow of the solder compound; the instant invention does the same
9. the prior art etches the second seed layer using the solder ball as a mask; the instant invention etches the first seed layer using the patterned re-routing metal as a mask.

The essential differences between the prior art and the instant invention is provided by the two plating steps and can, for easy reference be summarized as follows:

| Prior Art | Instant Invention |
|---|---|
| First plating step | |
| $1^{st}$ seed layer dep. | $1^{st}$ seed layer dep. |
| plate re-routing metal | plate re-routing metal |
| etch $1^{st}$ seed layer | (no equivalent step) |
| Second plating step | |
| $2^{st}$ seed layer dep. | (no equivalent step) |
| plate UBM + solder | plate UBM + metal + solder |
| etch $2^{st}$ seed layer | etch $1^{st}$ seed layer |

The advantages of the instant invention can be summarized as follows:

1. the height of the metal pillar (layers 54 and 56, FIG. 10) allows for high stand-off between the surface of substrate 10, thereby reducing impact of mismatching of thermal fatigue between interfacing surfaces such as the surface of the substrate 10 and the layers of metal that are part of the solder bump
2. the layer 44 has been highlighted as being a layer of or polymer or elastomer and is selected for its ability to provide stress release between overlying surfaces and thus to enhance solder bump reliability
3. the re-distribution solder bump of the invention allows for creating a flip-chip package without the need for semiconductor device redesign or changes in the pitch of the contact points of the package (the pitch of contact balls 72 and 68, FIGS. 11 and 12); the package size can also remain constant while still being able to package die of different dimensions (due to the flexibility of the routing of the re-routing metal layer 50, FIG. 50, FIG. 10)
4. the method of creating the solder pillar and the solder bump, that is plating a layer of UBM over which metal is plated twice, contributes a significant cost saving in both materials used and in the manufacturing cost; the need for separate UBM plating and etching, for separate plating and etching the pillar metal and for separate plating and etching the solder compound is reduced to using one photoresist mask that is applied for all three steps
5. by creating a relatively high layer of pillar metal, the solder ball is removed from the surface of the substrate; from this follows that low-alpha solder is no longer required as a solder compound for the solder bump, reducing manufacturing costs; from this further follows that soft-error concerns that typically apply to memory chip designs are less valid using the solder bump of the invention
6. by creating a relatively high layer of pillar metal, the solder ball of the instant invention will not wet to the re-routing metal trace. Thus, the second layer of passivation material, which typically serves as a solder mask, is no longer required and, consequently, processing cost is reduced.

In sum: the invention provides a method to create a solder bump having a high metal pillar and a solder ball. Seed/barrier layer deposition is limited to one deposition, a first metal plating step defines the re-routing metal, a second metal plating step creates the solder bump. The need for additional layers of passivation or solder mask has been removed.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for fabricating a circuit component, comprising:
providing a first device comprising semiconductor substrate, a conductive pad over said semiconductor substrate, and a polymer layer over said semiconductor substrate, wherein a first opening in said polymer layer is over a contact point of said conductive pad;
forming a first conductive layer on said contact point of said conductive pad and said polymer layer;
forming a second conductive layer on said first conductive layer; forming a first photoresist layer over said semiconductor substrate; electroplating a conductive interconnect in a second opening in said first photoresist layer, wherein said conductive interconnect is coupled to said contact point through said second conductive layer;

forming a nickel-containing layer over said copper conductive interconnect wherein said nickel-containing layer has a width greater than a width of said conductive interconnect;

forming a solder over said nickel-containing layer, in which said solder has a width equal to the width of said nickel-containing layer; and after said forming said second conductive layer, removing said first conductive layer not under said second conductive layer.

2. The method of claim 1, wherein said polymer layer comprises polyimide.

3. The method of claim 1, wherein said forming said first conductive layer comprises forming a titanium-containing layer over said contact point and said polymer layer.

4. The method of claim 1, wherein said forming said first conductive layer comprises forming a tantalum-containing layer over said contact point and said polymer layer.

5. The method of claim 1 further comprising oxidizing a surface of said conductive interconnect.

6. The method of claim 1, wherein said forming said first conductive layer comprises a sputtering process.

7. The method of claim 1, wherein said forming said second conductive layer comprises an electroplating process.

8. The method of claim 1, after said forming said first conductive layer, further comprising forming a second photoresist layer on said first conductive layer, wherein a third opening in said second photoresist layer exposes a region of said first conductive layer, next said forming said second conductive layer further on said region and in said third opening, and then removing said second photoresist layer.

9. The method of claim 1, whereby an underfill is configured to be between said first device and a second device configured to be bonded with said first device and to contact said first and second devices and a sidewall of said conductive interconnect.

10. The method of claim 1, whereby said second conductive layer has a sidewall not covered by said first conductive layer.

11. A method for fabricating a circuit component, comprising: providing a first device comprising a semiconductor substrate, a conductive pad over said semiconductor substrate, and a separating layer over said semiconductor substrate, wherein a first opening in said separating layer is over a contact point of said conductive pad;

forming a first conductive layer on said contact point of said conductive pad and over said separating layer;

forming a second conductive layer on said first conductive layer;

electroplating a conductive interconnect in a second opening in a first photoresist layer, in which the conductive interconnect is coupled to said contact point through said second conductive layer;

forming a nickel-containing layer over said conductive interconnect and in said second opening, in which said nickel-containing layer has a width greater than a width of said conductive interconnect;

forming a solder over said nickel-containing layer, in which the solder has a width equal to the width of said nickel-containing layer; and removing said first conductive layer not under said second conductive layer, whereby said second conductive layer has a sidewall not covered by said first conductive layer.

12. The method of claim 11, wherein said forming said first conductive layer comprises forming a titanium-containing layer over said contact point and said separating layer.

13. The method of claim 11 wherein said forming said first conductive layer comprises forming a tantalum-containing layer over said contact point and said separating layer.

14. The method of claim 11 further comprising oxidizing a surface of said conductive interconnect.

15. The method of claim 11, wherein said forming said first conductive layer comprises a sputtering process.

16. The method of claim 11, wherein said forming said second conductive layer comprises an electroplating process.

17. The method of claim 11 after said forming said first conductive layer, further comprising forming a second photoresist layer on said first conductive layer, wherein a third opening in said second photoresist layer exposes a region of said first conductive layer, next said forming said second conductive layer further on said region and in said third opening, and then removing said second photoresist layer.

18. A method for fabricating a circuit component, comprising: providing a first device comprising a semiconductor substrate, a conductive pad over said semiconductor substrate, and a polymer layer over said semiconductor substrate, wherein a first opening in said polymer layer is over a contact point of said conductive pad;

forming a first conductive layer on said contact point of said conductive pad and said polymer layer;

forming a second conductive layer on said first conductive layer; forming a first photoresist layer over said semiconductor substrate; electroplating a conductive interconnect in a second opening in said first photoresist layer, in which said conductive interconnect is coupled to said contact point through said second conductive layer;

forming a nickel-containing layer over the conductive interconnect in the second opening, the nickel-containing layer having a width greater than a width of the conductive interconnect;

forming a solder over the nickel-containing layer, in which said solder has a width equal to the width of said nickel-containing layer.

19. The method of claim 18, wherein said polymer layer comprises polymide.

20. The method of claim 18, wherein said forming said first conductive layer comprises forming a titanium-containing layer over said contact point and said polymer layer.

21. The method of claim 18, wherein said forming said first conductive layer comprises forming a tantalum-containing layer over said contact point and said polymer layer.

22. The method of claim 18 further comprising oxidizing a surface of said conductive interconnect.

23. The method of claim 18, wherein said forming said first conductive layer comprises a sputtering process.

24. The method of claim 18, wherein said forming said second conductive layer comprises an electroplating process.

25. The method of claim 18, after said forming said first conductive layer, further comprising forming a second photoresist layer on said first conductive layer, wherein a third opening in said second photoresist layer exposes a region of said first conductive layer, next said forming said second conductive layer further on said region and in said third opening, and then removing said second photoresist layer.

26. The method of claim 18, whereby an underfill is configured to be between said first device and a second device configured to be bonded with said first device and to contact said first and second devices and a sidewall of said conductive interconnect.

27. The method of claim 18, whereby said second conductive layer has a sidewall not covered by said first conductive layer.

28. The method of claim 18 further comprising said forming said solder with a thickness between 10 and 100 micrometers.

29. A method for fabricating a circuit component, comprising: providing a first device comprising a semiconductor substrate, a conductive pad over said semiconductor substrate, and a separating layer over said semiconductor substrate;
   forming a first conductive layer on a contact point of said conductive pad;
   forming a second conductive layer on said first conductive layer;
   forming a first photoresist layer over said semiconductor substrate;
   electroplating a conductive interconnect in an opening in said first photoresist layer, in which said conductive interconnect is coupled to said contact point through said second conductive layer;
   forming a gold-containing layer over said conductive interconnect and in said opening;
   after said forming said gold-containing layer, removing said first photoresist layer; and
   after said forming said second conductive layer, removing said first conductive layer not under said second conductive layer, in which a width of the gold-containing layer is wider than a width of the conductive interconnect.

30. The method of claim 29, wherein said forming said first conductive layer comprises forming a titanium-containing layer over said contact point and said separating layer.

31. The method of claim 29 further comprising oxidizing a surface of said conductive interconnect.

32. The method of claim 29, wherein said forming said first conductive layer comprises a sputtering process.

33. The method of claim 29, wherein said forming said second conductive layer comprises an electroplating process.

34. The method of claim 29, after said forming said first conductive layer, further comprising forming a second photoresist layer on said first conductive layer, wherein a second opening in said second photoresist layer exposes a region of said first conductive layer, next said forming said second conductive layer further on said region and in second opening, and then removing said second photoresist layer.

35. A method for fabricating a circuit component, comprising: providing a first device comprising a semiconductor substrate, a conductive pad over said semiconductor substrate, and a separating layer over said semiconductor substrate,
   forming a first conductive layer on a contact point of said conductive pad and over said separating layer;
   forming a second conductive layer on said first conductive layer;
   forming a first photoresist layer over said semiconductor substrate;
   electroplating a conductive interconnect in a first opening in said first photoresist layer, in which the conductive interconnect is coupled to said contact point through said second conductive layer;
   forming a nickel-containing layer over said conductive interconnect and in said first opening, in which the nickel-containing layer has a width greater than a width of said conductive interconnect;
   forming a solder over said nickel-containing layer, in which the solder has a width equal to the width of said nickel-containing layer;
   and removing said first conductive layer not under said second conductive layer, whereby said second conductive layer has a sidewall not covered by said first conductive layer, whereby an underfill is configured to be between said first device and a second device configured to be bonded with said first device and to contact said first and second devices and a sidewall of said conductive interconnect.

36. The method of claim 35, wherein said forming said first conductive layer comprises forming a titanium-containing layer.

37. The method of claim 35, wherein said forming said first conductive layer comprises forming a tantalum-containing layer.

38. The method of claim 35, after said electroplating said conductive interconnect, further comprising forming a nickel-containing layer over said conductive interconnect and in said second opening, followed by said removing said first photoresist layer.

39. The method of claim 35, after said electroplating said conductive interconnect, further comprising forming a gold-containing layer over said conductive interconnect and in said second opening, followed by said removing said first photoresist layer.

40. The method of claim 35, after said electroplating said conductive interconnect, further comprising forming a solder over said conductive interconnect and in said second opening, followed by said removing said first photoresist layer.

41. The method of claim 35, wherein said forming said second conductive layer comprises an electroplating process.

42. The method of claim 35, after said forming said first conductive layer, further comprising forming a second photoresist layer on said first conductive layer, wherein a second opening in said second photoresist layer exposes a region of said first conductive layer, next said forming said second conductive layer further on said region and in said second opening, and then removing said second photoresist layer.

* * * * *